US012568739B2

(12) United States Patent　　　(10) Patent No.:　US 12,568,739 B2
Lee et al.　　　　　　　　　　　　(45) Date of Patent:　Mar. 3, 2026

(54) DISPLAY DEVICE

(71) Applicant: Samsung Display Co., Ltd., Yongin-Si (KR)

(72) Inventors: Jiseon Lee, Hwaseong-si (KR); Seung-Hwan Cho, Yongin-si (KR); Wonsuk Choi, Seoul (KR); Kiho Bang, Hwaseong-si (KR); Seokje Seong, Seongnam-si (KR); Hyeonwoo Shin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 811 days.

(21) Appl. No.: 17/859,732

(22) Filed: Jul. 7, 2022

(65) Prior Publication Data

US 2023/0087508 A1　　Mar. 23, 2023

(30) Foreign Application Priority Data

Sep. 17, 2021　(KR) ......................... 10-2021-0124528

(51) Int. Cl.
*H10K 59/131*　　　(2023.01)
*H10D 86/40*　　　(2025.01)
*H10D 86/60*　　　(2025.01)
*H10K 59/121*　　　(2023.01)

(52) U.S. Cl.
CPC ......... *H10K 59/131* (2023.02); *H10D 86/471* (2025.01); *H10D 86/60* (2025.01); *H10K 59/121* (2023.02); *G09G 2300/0426* (2013.01)

(58) Field of Classification Search
CPC .. H10K 59/131; H10K 59/121; H10D 86/471; H10D 86/60; G09G 2300/0426
See application file for complete search history.

(56) References Cited

U.S. PATENT DOCUMENTS

2017/0033173 A1 *　2/2017　Kim ..................... G09G 3/3233
2018/0190750 A1 *　7/2018　Choi .................... H10K 59/131
(Continued)

FOREIGN PATENT DOCUMENTS

KR　　　10-1486038 B1　　1/2015
KR　　10-2020-0136520 A　　12/2020
KR　　10-2021-0010686 A　　1/2021
(Continued)

*Primary Examiner* — Adam R. Giesy
(74) *Attorney, Agent, or Firm* — Innovation Counsel LLP

(57) ABSTRACT

A display device may include an active layer disposed on a substrate, a first conductive layer disposed on the active layer and including a gate electrode, a second conductive layer disposed on the first conductive layer, a third conductive layer disposed on the second conductive layer and including a connection electrode connecting the active layer and the gate electrode, a fourth conductive layer disposed on the third conductive layer and including a first driving voltage line extending in a first direction, and a fifth conductive layer disposed on the fourth conductive layer and including a first connection line extending in a second direction intersecting the first direction. The first driving voltage line may include an extension portion which extends in the second direction and disposed between the second connection line and the connection electrode to overlap at least one of the second connection line and the connection electrode.

21 Claims, 15 Drawing Sheets

(56)          References Cited

U.S. PATENT DOCUMENTS

2021/0074783  A1      3/2021  Kang et al.
2021/0143241  A1      5/2021  Kim et al.

FOREIGN PATENT DOCUMENTS

KR      10-2021-0014810  A      2/2021
KR      10-2021-0029339  A      3/2021
KR      10-2021-0057280  A      5/2021

* cited by examiner

110:GW,GI,EM,111
120:VINT_H,121
130:ELVDD_V,VINT_V,VAINT_V,131,132,133

130:ELVDD_V,VINT_V,VAINT_V,131,132,133
140:ELVDD_H,VAINT_H,BRS_H,141,142
150:DL,BRS_V,151

130:ELVDD_V,VINT_V,VAINT_V,131,132,133
140:ELVDD_H,VAINT_H,BRS_H,141,142
150:DL,BRS_V,151

130:ELVDD_V,VINT_V,VAINT_V,131,132,133
140:ELVDD_H,VAINT_H,BRS_H,141,142
150:DL,BRS_V,151

DISPLAY DEVICE

CROSS-REFERENCE TO RELATED APPLICATION(S)

This application claims priority under 35 USC § 119 to Korean Patent Application No. 10-2021-0124528 filed on Sep. 17, 2021, in the Korean Intellectual Property Office (KIPO), the entire disclosure of which is incorporated by reference herein.

BACKGROUND

1. Field

Embodiments relate to a display device.

2. Description of the Related Art

The display device is a device that displays an image for providing visual information to a user. Recently, an organic light emitting display device has been attracting attention among display devices. The organic light emitting display device has a self-luminous property, and unlike a liquid crystal display device, it does not require a separate light source, so that a thickness and a weight of the display device may be reduced. Further, the organic light emitting display device exhibits high quality characteristics such as low power consumption, high luminance, and high response speed.

Recently, the number of pixels arranged in a unit area has increased in order to implement a high-resolution display device. As the number of the pixels in the unit area increases, the number of stacked conductive layers may increase. When the number of the stacked conductive layers increases, coupling between the conductive layers may increase. When the coupling between the conductive layers increases, a scan on time (SOT) of the display device may decrease, power consumption of the display device may increase, and cross-talk of the display device may increase.

SUMMARY

Embodiments provide a display device in which coupling between conductive layers decreases.

A display device according to an embodiment may include an active layer disposed on a substrate; a first conductive layer disposed on the active layer, the first conductive layer including a gate electrode; a second conductive layer disposed on the first conductive layer; a third conductive layer disposed on the second conductive layer, the third conductive layer including a connection electrode connecting the active layer and the gate electrode; a fourth conductive layer disposed on the third conductive layer, the fourth conductive layer including a first driving voltage line extending in a first direction; and a fifth conductive layer disposed on the fourth conductive layer, the fifth conductive layer including a first connection line extending in a second direction intersecting the first direction. The first driving voltage line may include an extension portion which extends in the second direction and disposed between the first connection line and the connection electrode to overlap at least one of the first connection line and the connection electrode.

In an embodiment, the extension portion may overlap the first connection line.

In an embodiment, a width of the extension portion in the first direction may be greater than a width of the first connection line in the first direction.

In an embodiment, the extension portion may overlap the connection electrode.

In an embodiment, a width of the extension portion in first direction may be greater than a width of the connection electrode in the first direction.

In an embodiment, a length of the extension portion in the second direction may be greater than a length of the connection electrode in the second direction.

In an embodiment, an area of the extension portion may be greater than an area of the connection electrode.

In an embodiment, the active layer may include a first region overlapping the gate electrode and a second region spaced apart from the first region. The connection electrode may connect the gate electrode and the second region of the active layer.

In an embodiment, the first region of the active layer may include a channel of a driving transistor. The second region of the active layer may include a drain of a compensation transistor and a drain of an initialization transistor.

In an embodiment, the first conductive layer may further include a gate line extending in the first direction. The second conductive layer may include a first initialization voltage line extending in the first direction. The fourth conductive layer may further include a second connection line extending in the first direction and connected to the first connection line.

In an embodiment, at least a portion of the first initialization voltage line may overlap the second connection line.

In an embodiment, the gate line may include a gate of an initialization transistor.

In an embodiment, the third conductive layer may further include: a second driving voltage line extending in the second direction and connected to the first driving voltage line; and a second initialization voltage line extending in the second direction and connected to the first initialization voltage line.

In an embodiment, the first connection line may overlap the second driving voltage line.

In an embodiment, the first connection line may overlap the second initialization voltage line.

In an embodiment, the fifth conductive layer may further include a data line extending in the second direction.

A display device according to an embodiment may include an active layer disposed on a substrate; a first conductive layer disposed on the active layer, the first conductive layer including a gate electrode; a second conductive layer disposed on the first conductive layer; a third conductive layer disposed on the second conductive layer, the third conductive layer including a connection electrode connecting the active layer and the gate electrode; a fourth conductive layer disposed on the third conductive layer, the fourth conductive layer including a first driving voltage line extending in a first direction and a first connection line extending in the first direction; and a fifth conductive layer disposed on the fourth conductive layer, the fifth conductive layer including a data line extending in a second direction intersecting the first direction and a second connection line extending in the second direction and connected to the first connection line. The first driving voltage line may include an extension portion which extends in the second direction and disposed between the second connection line and the connection electrode to overlap at least one of the second connection line and the connection electrode.

In an embodiment, the third conductive layer may further include a second driving voltage line extending in the second direction and connected to the first driving voltage line.

A display device according to an embodiment may include an active layer disposed on a substrate; a first conductive layer disposed on the active layer, the first conductive layer including a gate line extending in a first direction; a second conductive layer disposed on the first conductive layer, the second conductive layer including a first initialization voltage line extending in the first direction; a third conductive layer disposed on the second conductive layer; a fourth conductive layer disposed on the third conductive layer, the fourth conductive layer including a first connection line extending in the first direction; and a fifth conductive layer disposed on the fourth conductive layer, the fifth conductive layer including a second connection line extending in a second direction intersecting the first direction and connected to the first connection line. At least a portion of the first initialization voltage line may overlap the first connection line.

In an embodiment, the third conductive layer may include a second initialization voltage line extending in the second direction and connected to the first initialization voltage line.

In an embodiment, the gate line may include a gate of an initialization transistor.

In the display device according to the embodiments, a line transmitting a constant voltage may be disposed between the stacked conductive layers to shield between the conductive layers, so that the coupling between the conductive layers may decrease. Accordingly, a sufficient scan on time (SOT) of the display device may be secured, the power consumption of the display device may decrease, and the crosstalk of the display device may decrease.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices in accordance with embodiments will be explained in detail with reference to the accompanying drawings.

Figure 1:
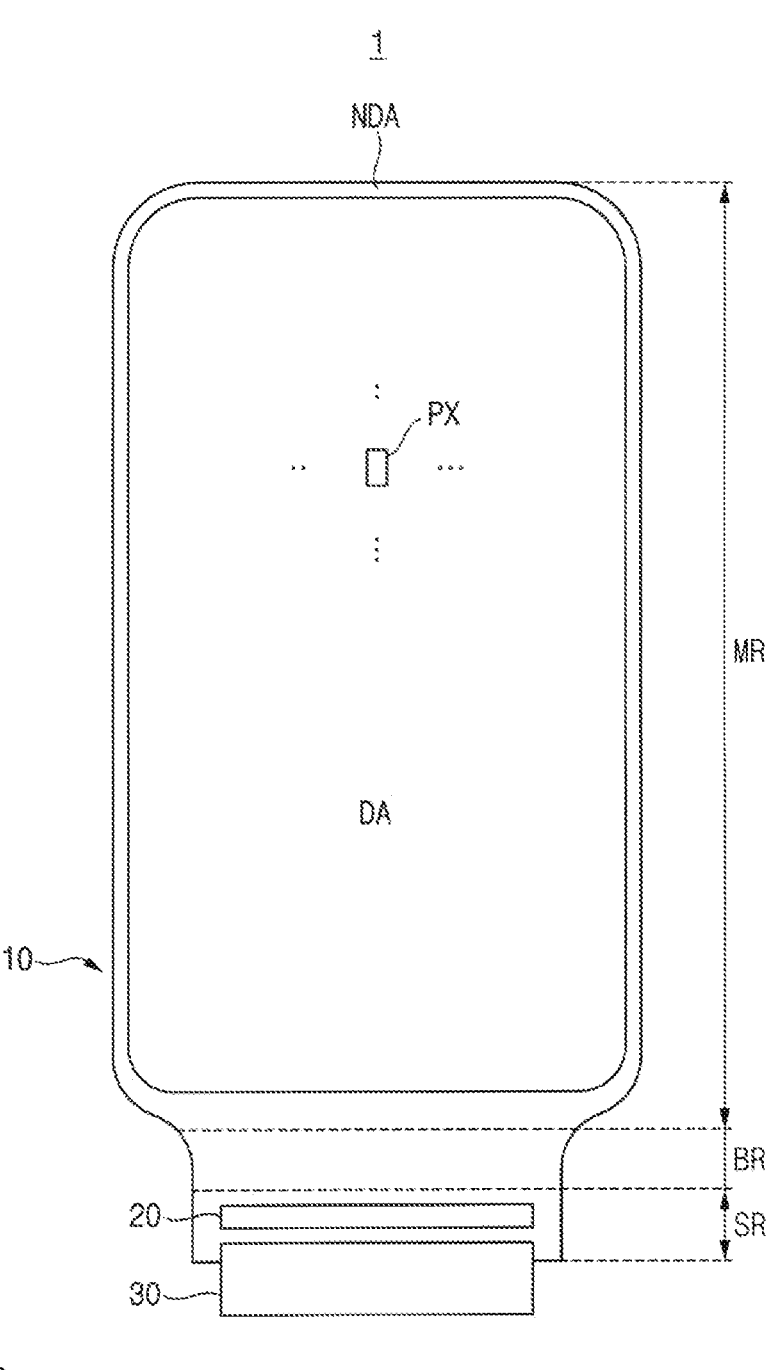
FIG. 1 is a plan view illustrating a display device according to an embodiment.
Figure 1:
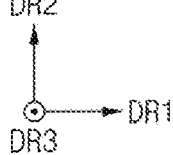

FIG. 1 is a plan view illustrating a display device 1 according to an embodiment.

Figure 2:
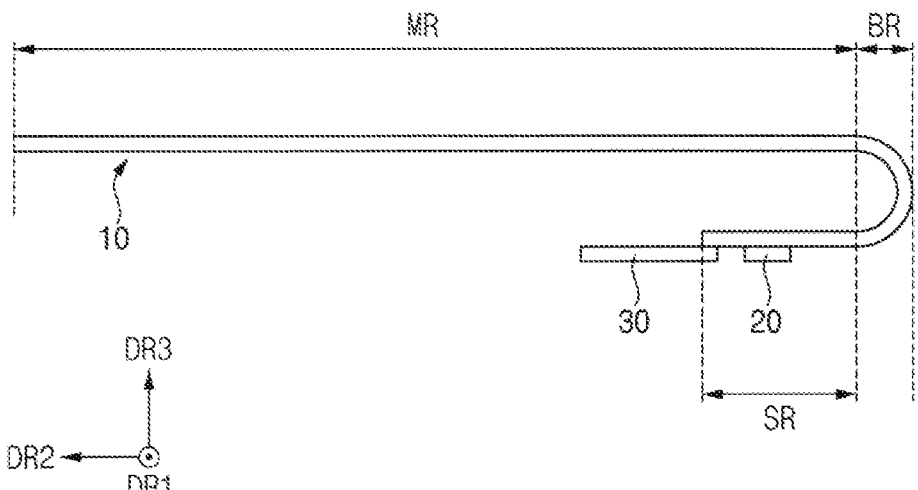
FIG. 2 is a cross-sectional view illustrating a display device according to an embodiment.

FIG. 2 is a cross-sectional view illustrating the display device 1 according to an embodiment.

Referring to FIGS. 1 and 2, the display device 1 may include a display panel 10, a driving chip 20, and a driving circuit board 30.

The display panel 10 may include a main region MR, a sub region SR, and a bending region BR. The sub region SR may be spaced apart from the main region MR, and the bending region BR may be disposed between the main region MR and the sub region SR.

The bending region BR may extend from the main region MR. A width of the bending region BR in a first direction DR1 may be less than a width of the main region MR in the first direction DR1. The bending region BR may have a curvature, and may be bent in a direction opposite to a third direction DR3 intersecting the first direction DR1.

The sub region SR may extend from the bending region BR. The sub region SR may extend in a direction parallel to the main region MR. The sub region SR may overlap the main region MR in the third direction DR3.

The display panel 10 may include a display area DA and a non-display area NDA. The display area DA may include pixels PX. The pixels PX may be arranged along the first direction DR1 and a second direction DR2 intersecting the first direction DR1 and the third direction DR3. The display area DA may display an image through light emitted from the pixels PX. The non-display area NDA may not display an image.

The display area DA may be disposed in a center portion of the main region MR. The non-display area NDA may be disposed at the bending region BR, the sub region SR, and at least one edge of the main region MR.

The driving chip 20 may be disposed on the sub region SR of the display panel 10. A first pad portion including a plurality of pads may be disposed in the sub region SR of the display panel 10 and the driving chip 20 may be connected to the first pad portion. The driving chip 20 may include an integrated circuit for driving the display panel 10. In an embodiment, the integrated circuit may be a data integrated circuit that generates a data voltage.

The driving chip 20 may be mounted on the sub region SR of the display panel 10. The driving chip 20 may be attached to the sub region SR of the display panel 10 through an anisotropic conductive film or may be attached to the sub region SR of the display panel 10 using ultrasonic bonding.

The driving circuit board 30 may be connected to an end of the sub region SR of the display panel 10. A second pad portion including a plurality of pads may be disposed at the end of the sub region SR of the display panel 10, and the driving circuit board 30 may be connected to the second pad portion. In an embodiment, the driving circuit board 30 may be a flexible printed circuit board.

Figure 3:
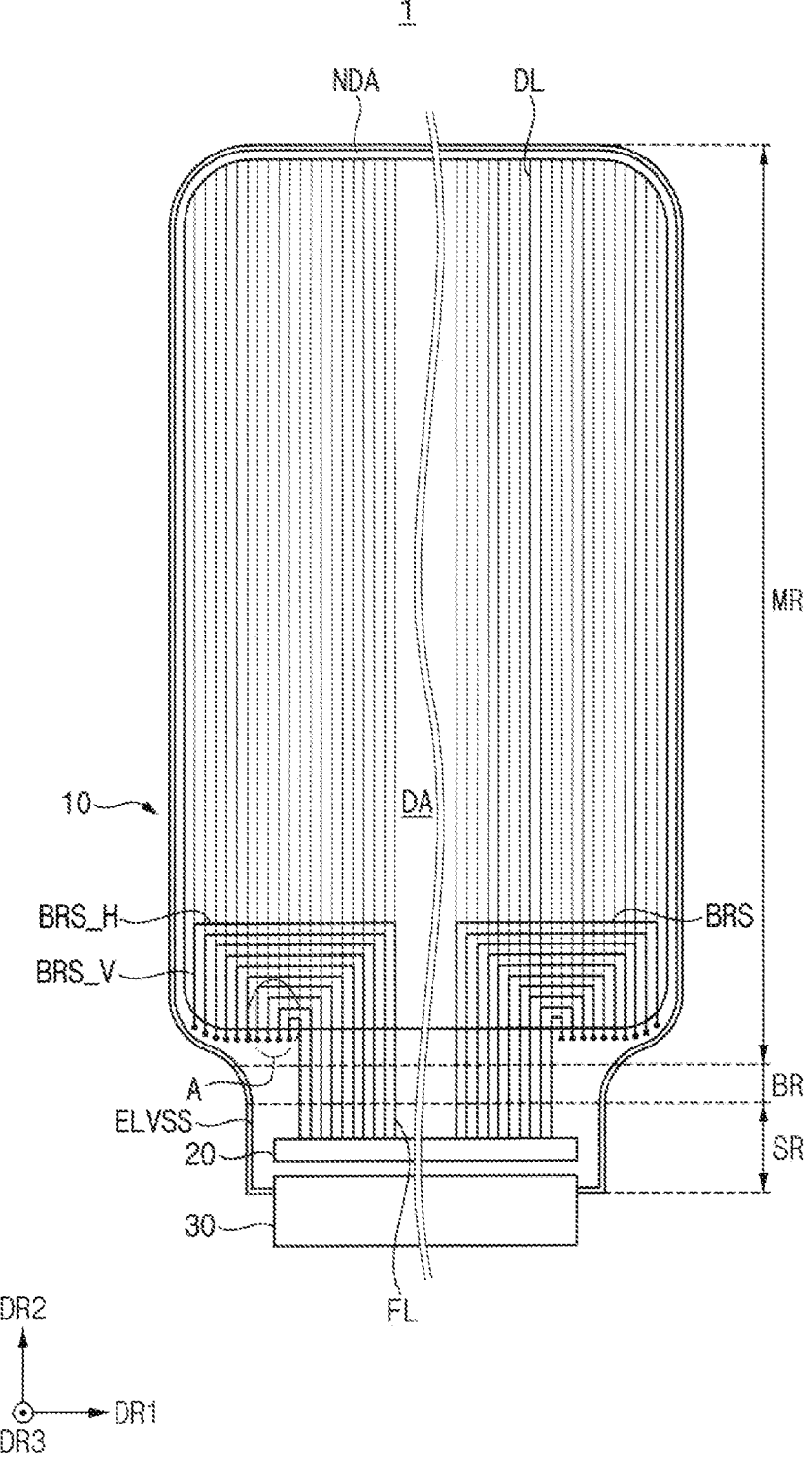
FIG. 3 is a plan view illustrating data lines, fan-out lines, a common voltage line, and connection lines of a display device according to an embodiment.
Figure 4:
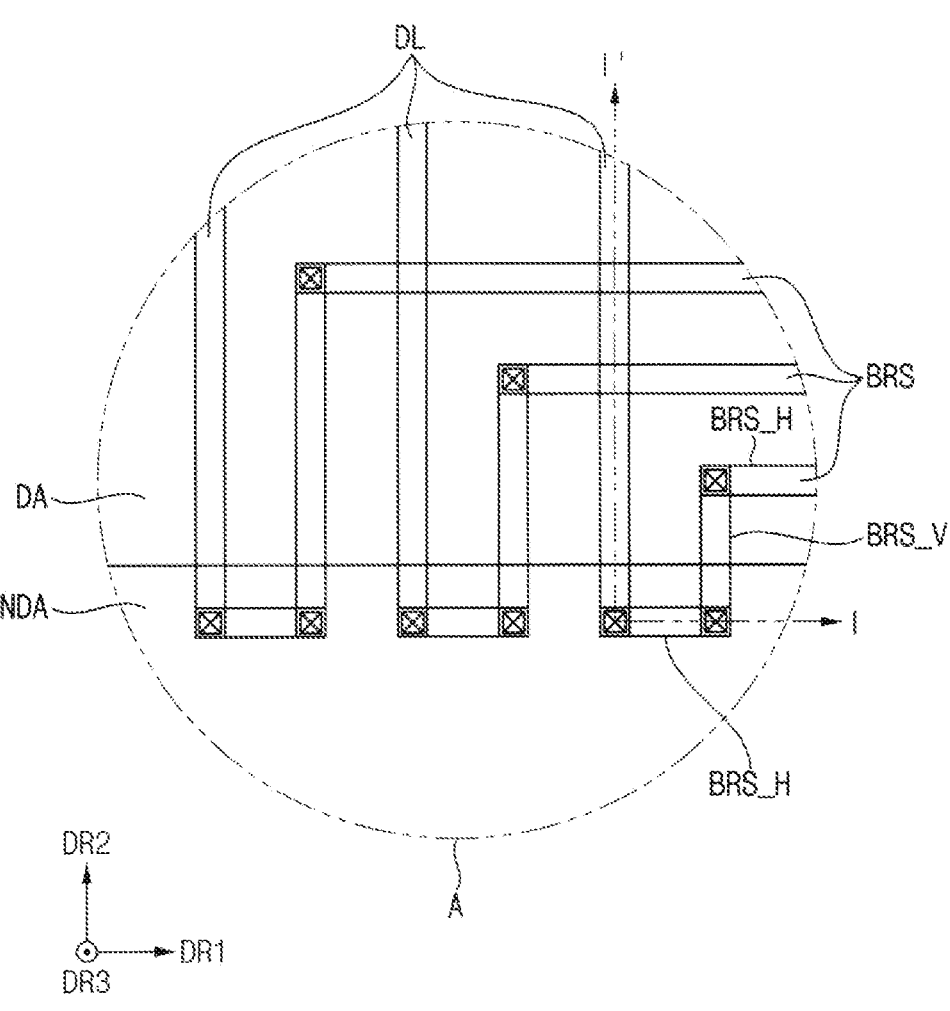
FIG. 4 is a plan view illustrating an area A in FIG. 3.
Figure 5:
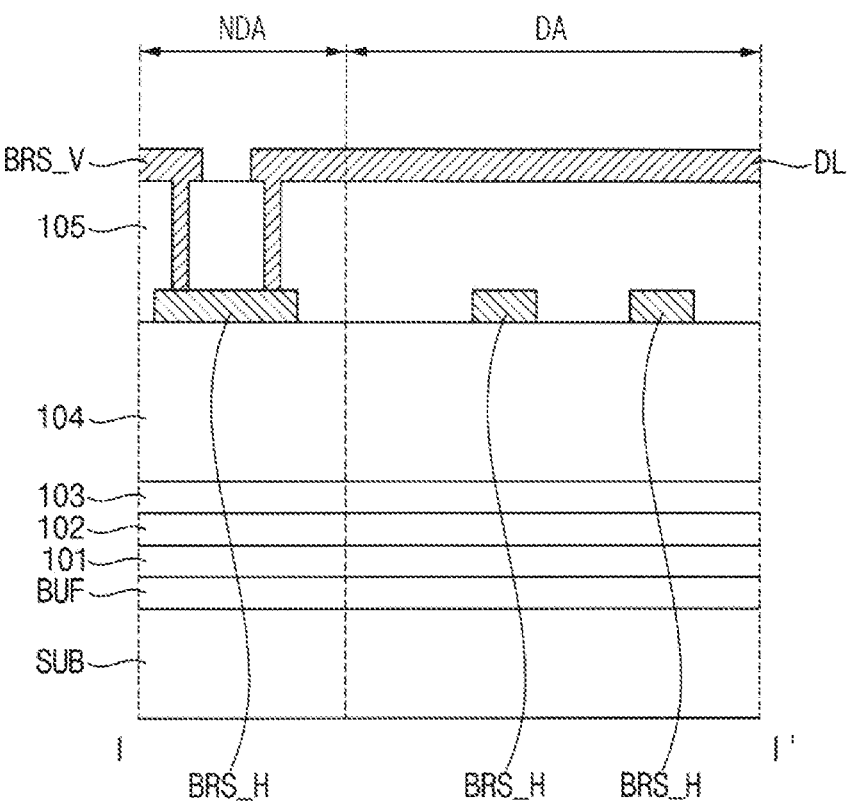
FIG. 5 is a cross-sectional view taken along a line I-I' in FIG. 4.

FIG. 3 is a plan view illustrating data lines DL, fan-out lines FL, a common voltage line ELVSS, and connection lines BRS of the display device 1 according to an embodiment. FIG. 4 is a plan view illustrating an area A in FIG. 3. FIG. 5 is a cross-sectional view taken along a line I-I' in FIG. 4.

Referring to FIGS. 3, 4, and 5, the display panel 10 may include data lines DL, fan-out lines FL, a common voltage line ELVSS, and connection lines BRS.

The data lines DL may be arranged in the first direction DR1 and may extend in the second direction DR2. The data line DL may cross the display area DA and one end of the data line DL may be disposed in the non-display area NDA. The data line DL may transmit the data voltage.

The fan-out lines FL may be arranged in the first direction DR1 and may extend in the second direction DR2. The fan-out line FL may extend from the sub region SR to the main region MR through the bending region BR and one end of the fan-out line FL may be connected to the driving chip 20. The fan-out line FL may transmit the data voltage from the driving chip 20.

The common voltage line ELVSS may extend from a first side of the driving circuit board 30 to a second side of the driving circuit board 30 through the non-display area NDA in the main region MR. One end of the common voltage line ELVSS may be connected to the first side of the driving circuit board 30 and the other end of the common voltage line ELVSS may be connected to the second side of the driving circuit board 30. The common voltage line ELVSS may transmit a common voltage.

The connection lines BRS may extend from the non-display area NDA toward the display area DA. The connection line BRS may connect the other end of the fan-out line FL and the one end of the data line DL and may transmit the data voltage from the fan-out line FL to the data line DL. The connection line BRS may go through the display area DA to be connected to the data line DL and the data voltage may be transmitted to the data line DL through the connection line BRS. Accordingly, an area in which the fan-out lines FL are disposed may decrease, and accordingly, a dead space of the display device 1 may decrease.

The connection line BRS may include a horizontal connection line BRS_H and a vertical connection line BRS_V. The horizontal connection line BRS_H may extend in the first direction DR1 and the vertical connection line BRS_V may extend in the second direction DR2.

The horizontal connection line BRS_H and the vertical connection line BRS_V may be disposed on different layers. The vertical connection line BRS_V and the data line DL may be disposed on the same layer. In an embodiment, as will be described later, the horizontal connection line BRS_H may be disposed on a fourth insulating layer 104, and the vertical connection line BRS_V and the data line DL may be disposed on a fifth insulating layer 105. The horizontal connection line BRS_H and the vertical connection line BRS_V may be connected through a contact hole formed in the fifth insulating layer 105, and the horizontal connection line BRS_H and the data line DL may be connected through a contact hole formed in the fifth insulating layer 105. As the horizontal connection line BRS_H and the vertical connection line BRS_V are disposed on different layers, a resistance of the connection line BRS may decrease, and accordingly, a scan on time (SOT) of the display device 1 may increase.

In an embodiment, some of the connection lines BRS may cross the display area DA, and may connect different portions of the common voltage line ELVSS. As the some of the connection lines BRS connects the different portions of the common voltage line ELVSS, a voltage drop of the common voltage may decrease, and accordingly, power consumption of the display device 1 may be improved.

Figure 6:
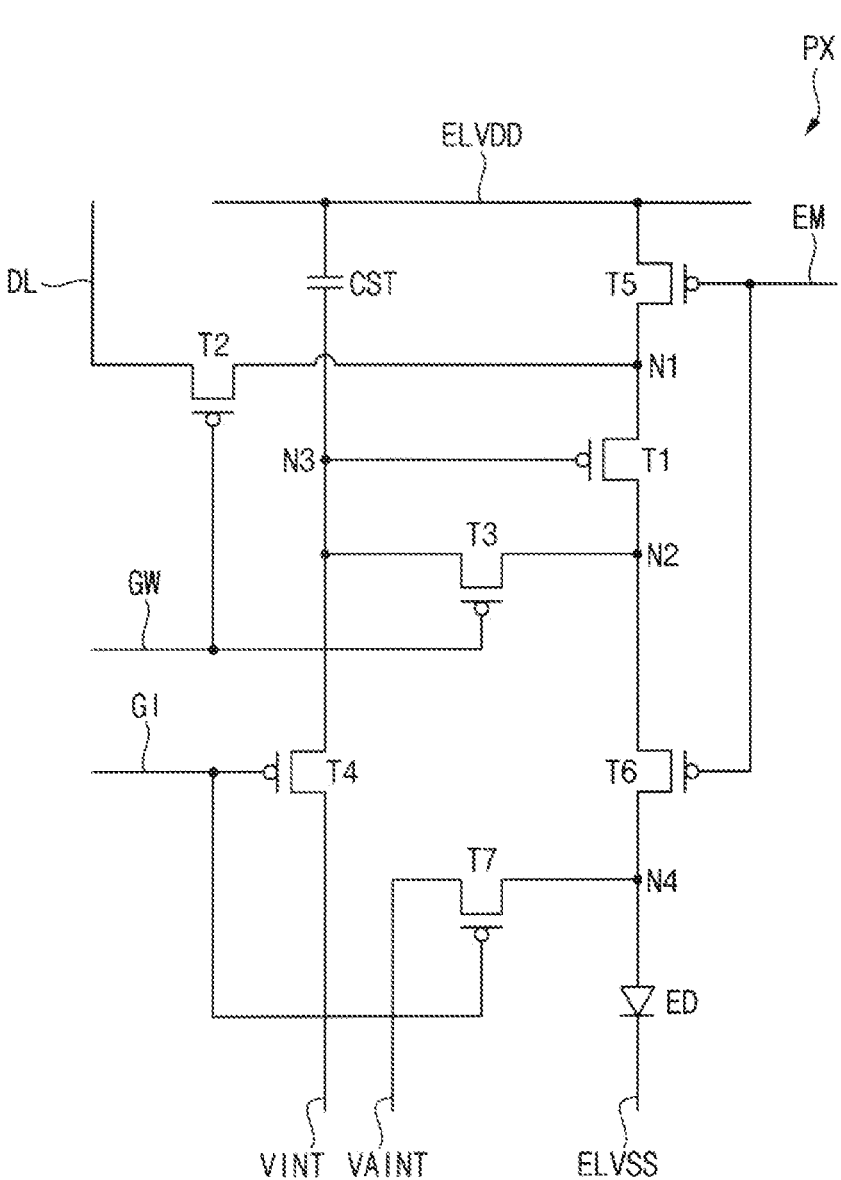
FIG. 6 is a circuit diagram illustrating a pixel according to an embodiment.

FIG. 6 is a circuit diagram illustrating the pixel PX according to an embodiment.

Referring to FIG. 6, the pixel PX may include a plurality of transistors, a storage capacitor CST, and a light emitting diode ED.

In an embodiment, the plurality of transistors may include a driving transistor T1, a switching transistor T2, a compensation transistor T3, an initialization transistor T4, a first emission control transistor T5, and a second emission control transistor T6, and a diode initialization transistor T7.

A source of the driving transistor T1 may be connected to a first node N1 and a drain of the driving transistor T1 may be connected to a second node N2. A gate of the driving transistor T1 may be connected to a third node N3. The driving transistor T1 may generate a driving current based on a driving voltage and the data voltage.

A source of the switching transistor T2 may be connected to the data line DL and a drain of the switching transistor T2 may be connected to the first node N1. A gate of the switching transistor T2 may be connected to a write gate line GW. The switching transistor T2 may transmit the data voltage transmitted from the data line DL to the first node N1 in response to a write gate signal transmitted from the write gate line GW.

A source of the compensation transistor T3 may be connected to the second node N2 and a drain of the compensation transistor T3 may be connected to the third node N3. A gate of the compensation transistor T3 may be connected to the write gate line GW. The compensation transistor T3 may connect the second node N2 and the third node N3 in response to the write gate signal. When the second node N2 and the third node N3 are connected, the driving transistor T1 may be diode-connected, and the data voltage, in which a threshold voltage of the driving transistor T1 is compensated, may be transmitted to the third node N3.

A source of the initialization transistor T4 may be connected to an initialization voltage line VINT and a drain of the initialization transistor T4 may be connected to the third node N3. A gate of the initialization transistor T4 may be connected to an initialization gate line GI. The initialization transistor T4 may transmit an initialization voltage transmitted from the initialization voltage line VINT to the third node N3 in response to an initialization gate signal transmitted from the initialization gate line GI.

A source of the first emission control transistor T5 may be connected to a driving voltage line ELVDD and a drain of the first emission control transistor T5 may be connected to the first node N1. A gate of the first emission control transistor T5 may be connected to an emission control line EM.

A source of the second emission control transistor T6 may be connected to the second node N2 and a drain of the second emission control transistor T6 may be connected to a fourth node N4. A gate of the second emission control transistor T6 may be connected to the emission control line EM.

The first emission control transistor T5 and the second emission control transistor T6 may transmit the driving current generated by the driving transistor T1 to the light emitting diode ED in response to an emission control signal transmitted from the emission control line EM.

A source of the diode initialization transistor T7 may be connected to a diode initialization voltage line VAINT and a drain of the diode initialization transistor T7 may be connected to the fourth node N4. A gate of the diode initialization transistor T7 may be connected to the initialization gate line GI. In an embodiment, when the pixel PX is disposed in an N-th row, the gate of the diode initialization transistor T7 may be connected to an initialization gate line GI disposed in an (N+1)-th row. The diode initialization transistor T7 may transmit a diode initialization voltage transmitted from the diode initialization voltage line VAINT to the fourth node N4 in response to the initialization gate signal.

In an embodiment, as illustrated in FIG. 6, each of the transistors T1, T2, T3, T4, T5, T6, and T7 may be a PMOS transistor. However, the present disclosure is not limited thereto, and, in another embodiment, at least one of the transistors T1, T2, T3, T4, T5, T6, and T7 may be an NMOS transistor.

A first end of the storage capacitor CST may be connected to the third node N3, and a second end of the storage capacitor CST may be connected to the driving voltage line ELVDD.

The light emitting diode ED may include an organic light emitting diode, an inorganic light emitting diode, a quantum dot light emitting diode, or the like. A first end of the light emitting diode ED may be connected to the fourth node N4 and a second end of the light emitting diode ED may be connected to the common voltage line ELVSS. The light emitting diode ED may emit light based on the driving current transmitted from the driving transistor T1.

Figure 7:
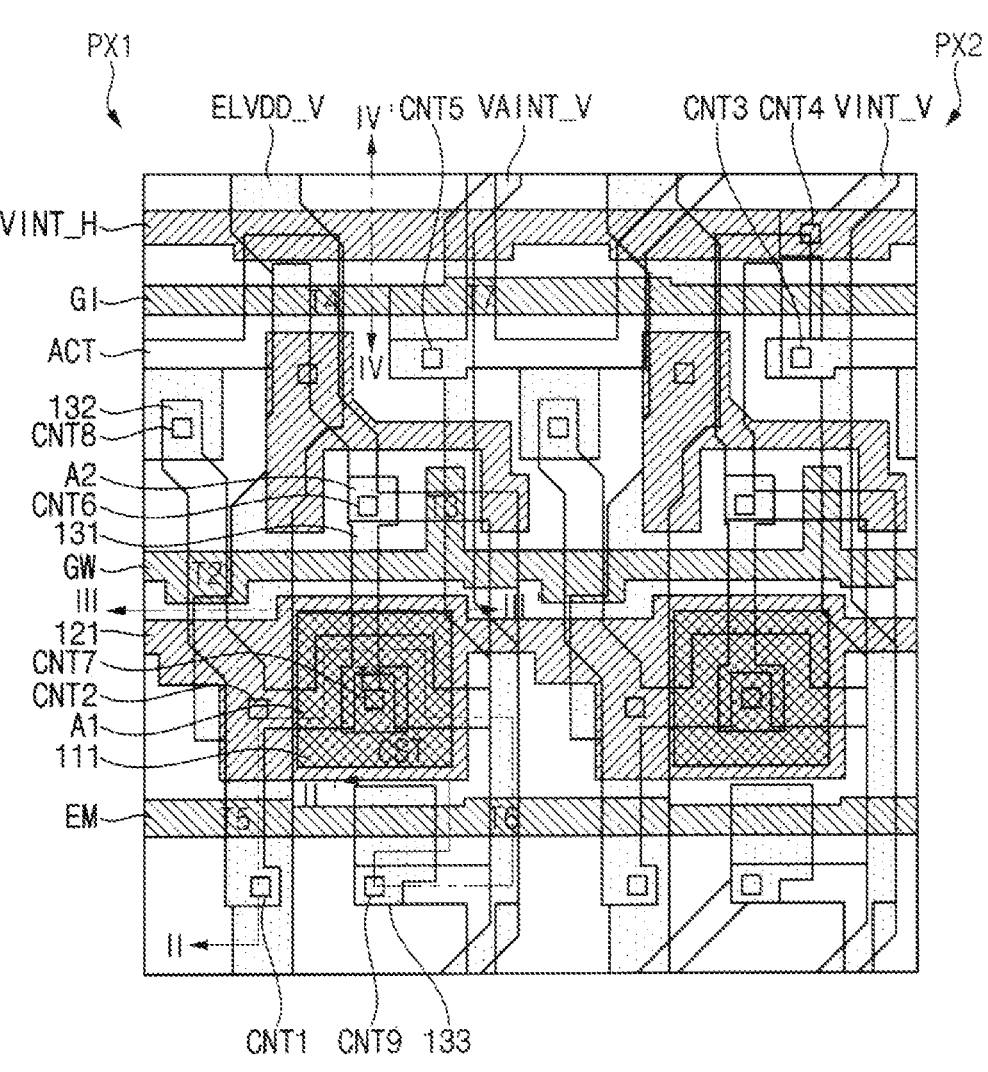
FIGS. 7 and 8 are plan views illustrating a first pixel and a second pixel according to an embodiment.
Figure 7:
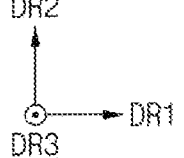
Figure 8:
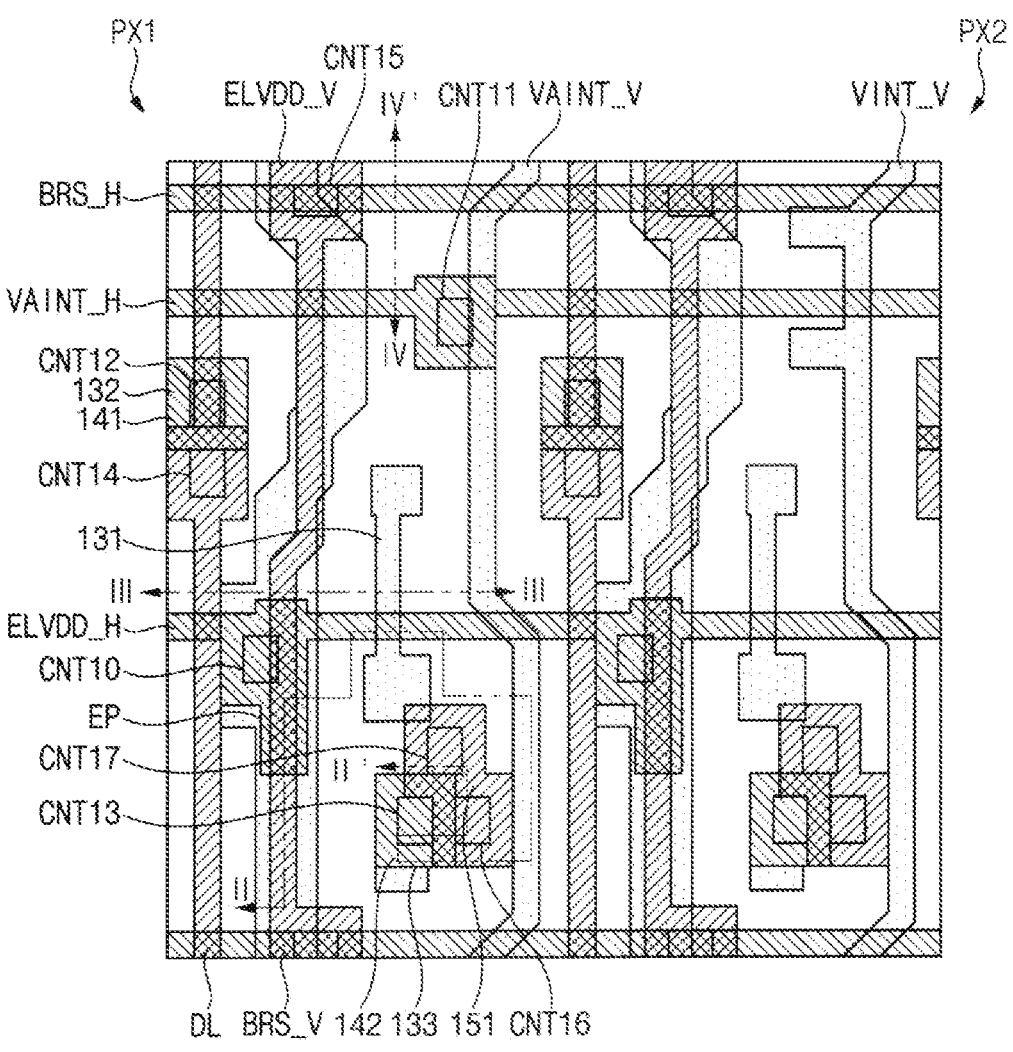
Figure 8:
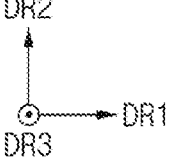
Figure 9:
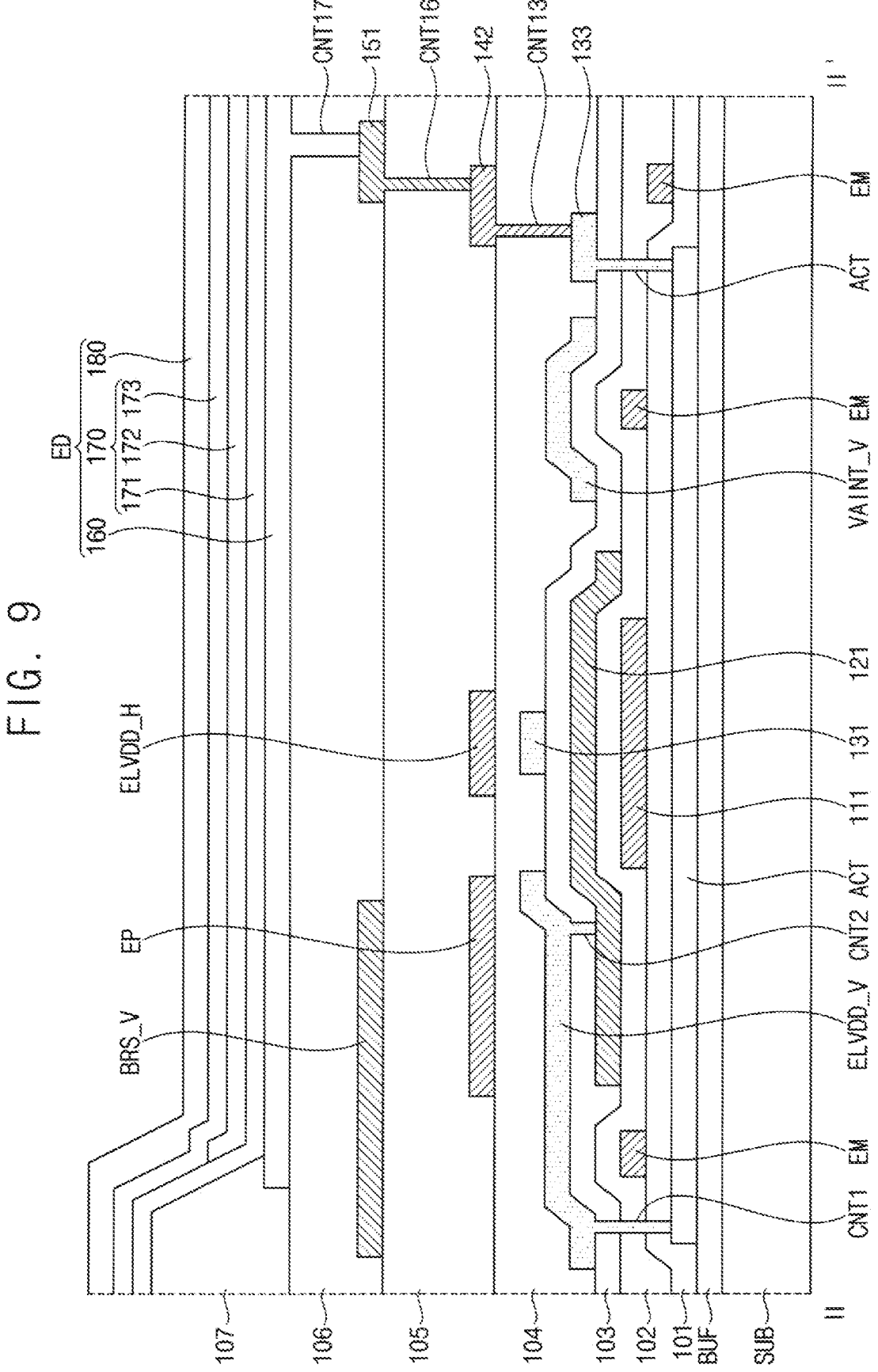
FIG. 9 is a cross-sectional view taken along a line II-II' in FIGS. 7 and 8.
Figure 10:
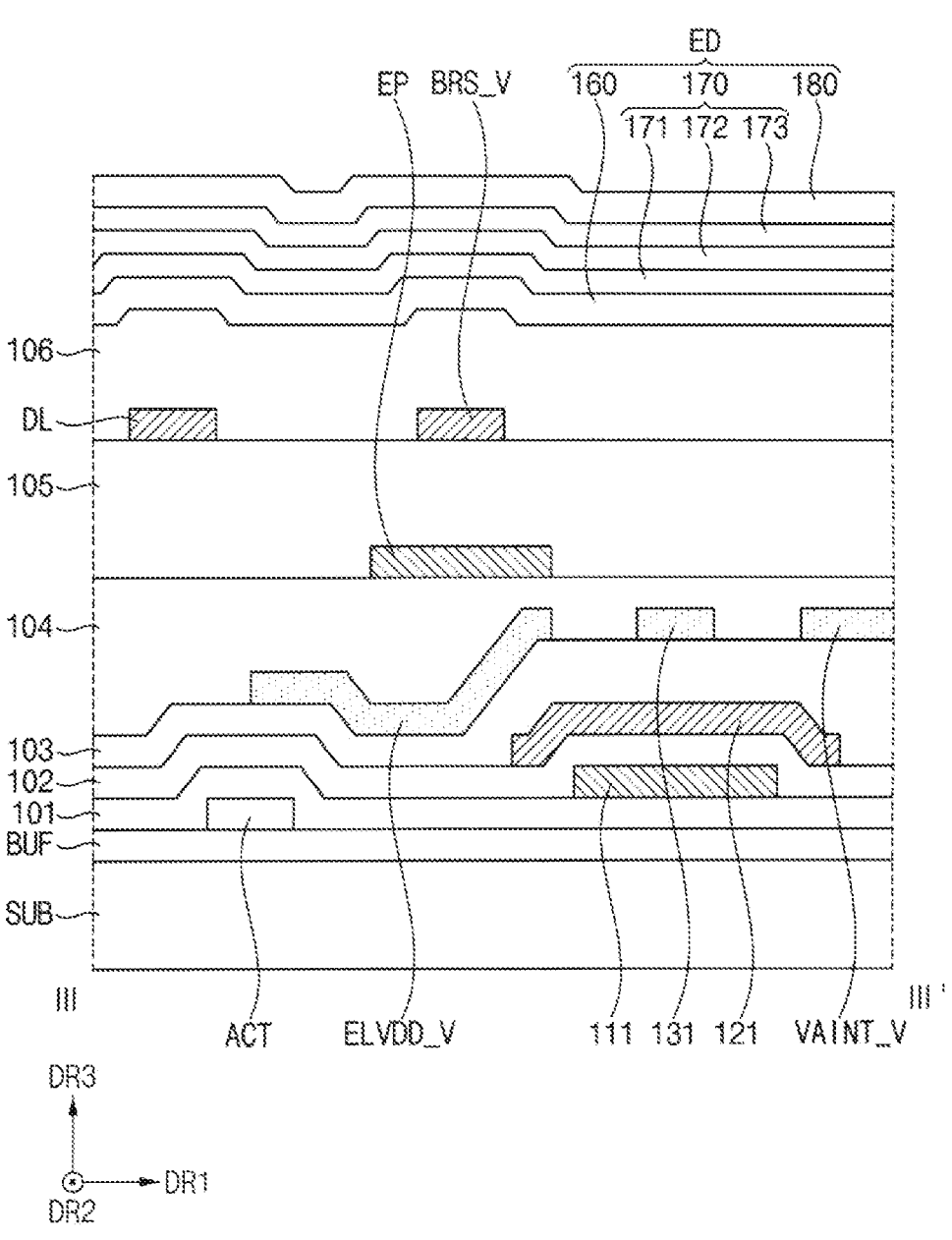
FIG. 10 is a cross-sectional view taken along a line III-III' in FIGS. 7 and 8.
Figure 11:
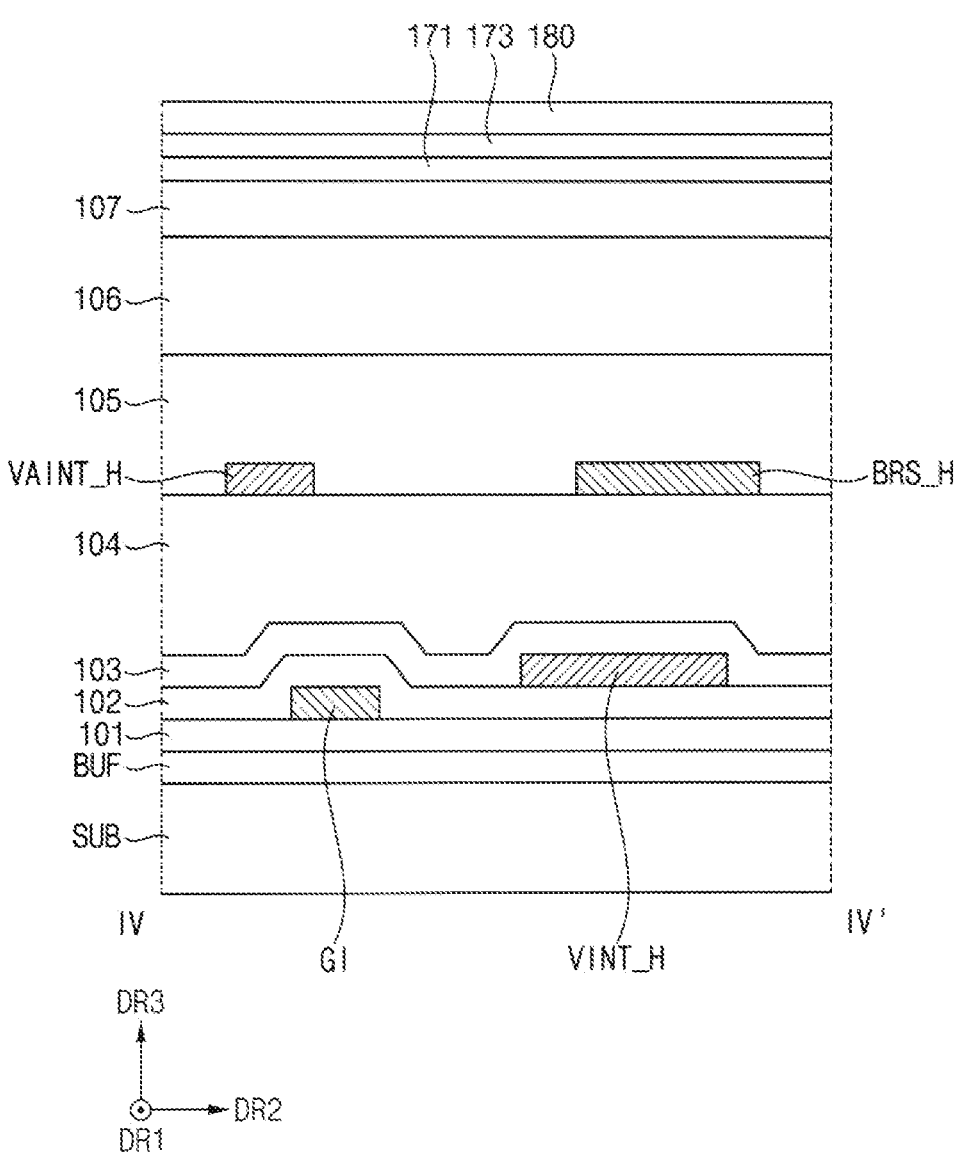
FIG. 11 is a cross-sectional view taken along a line IV-IIV' in FIGS. 7 and 8.

FIGS. 7 and 8 are plan views illustrating a first pixel PX1 and a second pixel PX2 according to an embodiment. FIG. 7 may illustrate an active layer ACT, a first conductive layer 110, a second conductive layer 120, and a third conductive layer 130 which are described later, and FIG. 8 may illustrate the third conductive layer 130, a fourth conductive layer 140, and a fifth conductive layer 150 which are described later. FIG. 9 is a cross-sectional view taken along a line II-II' in FIGS. 7 and 8. FIG. 10 is a cross-sectional view taken along a line III-III' in FIGS. 7 and 8. FIG. 11 is a cross-sectional view taken along a line IV-IIV' in FIGS. 7 and 8.

Referring to FIGS. 7, 8, 9, 10, and 11, the display device 1 may include a substrate SUB, a buffer layer BUF, an active layer ACT, a first insulating layer 101, a first conductive layer 110, a second insulating layer 102, a second conductive layer 120, a third insulating layer 103, a third conductive layer 130, a fourth insulating layer 104, a fourth conductive layer 140, a fifth insulating layer 105, a fifth conductive layer 150, a sixth insulating layer 106, a first electrode 160, a pixel defining layer 107, an intermediate layer 170, and a second electrode 180.

The first pixel PX1 and the second pixel PX2 may be disposed in the same row and adjacent columns. For example, when the first pixel PX1 is disposed in an N-th row and an M-th column, the second pixel PX2 may be disposed in the N-th row and an (M+1)-th column.

The substrate SUB may include glass, a polymer resin, or the like. For example, the polymer resin may include polyethersulfone, polyarylate, polyetherimide, polyethylene naphthalate, polyethylene terephthalate, polyphenylene sulfide, polyimide, polycarbonate, cellulose triacetate, cellulose acetate propionate, or the like.

The buffer layer BUF may be disposed on the substrate SUB. The buffer layer BUF may include silicon oxide, silicon nitride, or the like. The buffer layer BUF may have a single-layer structure or a multilayer structure. In an embodiment, the buffer layer BUF may have a multilayer structure including a silicon nitride layer and a silicon oxide layer which are sequentially stacked.

The active layer ACT may be disposed on the buffer layer BUF. The source, a channel, and the drain of each of the transistors T1, T2, T3, T4, T5, T6, and T7 may be disposed along the active layer ACT. In an embodiment, the active layer ACT may include amorphous silicon, polycrystalline silicon, or the like. In another embodiment, the active layer ACT may include an oxide semiconductor.

The active layer ACT may include a first region A1 and a second region A2 spaced apart from the first region A1. A gate electrode 111 to be described later may be disposed on the first region A1. The first region A1 may include the channel of the driving transistor T1, and the second region A2 may include the drain of the compensation transistor T3 and the drain of the initialization transistor T4.

The first insulating layer 101 may be disposed on the active layer ACT. The first insulating layer 101 may include silicon oxide, silicon nitride, or the like. The first insulating layer 101 may have a single-layer structure or a multilayer structure. In an embodiment, the first insulating layer 101 may have a single-layer structure including a silicon oxide layer.

The first conductive layer 110 may be disposed on the first insulating layer 101. The first conductive layer 110 may include a conductive material. The first conductive layer 110 may have a single-layer structure or a multilayer structure. In an embodiment, the first conductive layer 110 may have a single-layer structure including a molybdenum (Mo) layer.

The first conductive layer 110 may include the write gate line GW, the initialization gate line GI, the emission control line EM, and a gate electrode 111. The write gate line GW, the initialization gate line GI, the emission control line EM, and the gate electrode 111 may be spaced apart from each other.

The write gate line GW may extend in the first direction DR1. The write gate line GW may include the gate of the switching transistor T2 and the gate of the compensation transistor T3.

The initialization gate line GI may extend in the first direction DR1. The initialization gate line GI may include the gate of the initialization transistor T4 and the gate of the diode initialization transistor T7.

The emission control line EM may extend in the first direction DR1. The emission control line EM may include the gate of the first emission control transistor T5 and the gate of the second emission control transistor T6.

The gate electrode 111 may be disposed on the first region A1 of the active layer ACT. The gate electrode 111 may include the gate of the driving transistor T1 and the first end of the storage capacitor CST.

The second insulating layer 102 may be disposed on the first conductive layer 110. The second insulating layer 102 may include silicon oxide, silicon nitride, or the like. The second insulating layer 102 may have a single-layer structure or a multilayer structure. In an embodiment, the second insulating layer 102 may have a single-layer structure including a silicon nitride layer.

The second conductive layer 120 may be disposed on the second insulating layer 102. The second conductive layer 120 may include a conductive material. The second conductive layer 120 may have a single-layer structure or a multilayer structure. In an embodiment, the second conductive layer 120 may have a single-layer structure including a molybdenum (Mo) layer.

The second conductive layer 120 may include a horizontal initialization voltage line VINT_H and a capacitor electrode 121. The horizontal initialization voltage line VINT_H and the capacitor electrode 121 may be spaced apart from each other.

The horizontal initialization voltage line VINT_H may extend in the first direction DR1. At least a portion of the horizontal initialization voltage line VINT_H may overlap a horizontal connection line BRS_H to be described later.

The capacitor electrode 121 may include the second end of the storage capacitor CST.

The third insulating layer 103 may be disposed on the second conductive layer 120. The third insulating layer 103 may include silicon oxide, silicon nitride, or the like. The third insulating layer 103 may have a single-layer structure or a multilayer structure. In an embodiment, the third insulating layer 103 may have a multilayer structure including a silicon oxide layer and a silicon nitride layer which are sequentially stacked.

The third conductive layer 130 may be disposed on the third insulating layer 103. The third conductive layer 130 may include a conductive material. The third conductive layer 130 may have a single-layer structure or a multilayer structure. In an embodiment, the third conductive layer 130 may have a multilayer structure including a titanium (Ti) layer, an aluminum (Al) layer, and a titanium (Ti) layer which are sequentially stacked.

The third conductive layer 130 may include a vertical driving voltage line ELVDD_V, a vertical initialization voltage line VINT_V, a vertical diode initialization voltage line VAINT_V, a first connection electrode 131, a second connection electrode 132, and a third connection electrode 133. The vertical initialization voltage line VINT_V, the vertical diode initialization voltage line VAINT_V, the first connection electrode 131, the second connection electrode 132, and the third connection electrode 133 may be spaced apart from each other.

The vertical driving voltage line ELVDD_V may extend in the second direction DR2. The vertical driving voltage line ELVDD_V may be disposed in each of the first pixel PX1 and the second pixel PX2. The vertical driving voltage line ELVDD_V may be connected to the active layer ACT through a first contact hole CNT1, and may be connected to the capacitor electrode 121 through a second contact hole CNT2. A region of the active layer ACT connected to the vertical driving voltage line ELVDD_V through the first contact hole CNT1 may be the source of the first emission control transistor T5.

The vertical initialization voltage line VINT_V may extend in the second direction DR2. The vertical initialization voltage line VINT_V may be disposed in the second pixel PX2. The vertical initialization voltage line VINT_V may be connected to the active layer ACT through a third contact hole CNT3 and may be connected to the horizontal initialization voltage line VINT_H through a fourth contact hole CNT4. A region of the active layer ACT connected to the vertical initialization voltage line VINT_V through the third contact hole CNT3 may be the source of the initialization transistor T4. The horizontal initialization voltage line VINT_H and the vertical initialization voltage line VINT_V may form the initialization voltage line VINT in FIG. 6.

The vertical diode initialization voltage line VAINT_V may extend in the second direction DR2. The vertical diode initialization voltage line VAINT_V may be disposed in the first pixel PX1. The vertical diode initialization voltage line VAINT_V may be connected to the active layer ACT through a fifth contact hole CNT5. A region of the active layer ACT connected to the vertical diode initialization voltage line VAINT_V through the fifth contact hole CNT5 may be the source of the diode initialization transistor T7.

The first connection electrode 131 may connect the gate electrode 111 and the second region A2 of the active layer. The first connection electrode 131 may be connected to the second region A2 of the active layer ACT through a sixth contact hole CNT6, and may be connected to the gate electrode 111 through a seventh contact hole CNT7.

The second connection electrode 132 may be connected to the active layer ACT through an eighth contact hole CNT8. A region of the active layer ACT connected to the second connection electrode 132 through the eighth contact hole CNT8 may be the source of the switching transistor T2.

The third connection electrode 133 may be connected to the active layer ACT through a ninth contact hole CNT9. A region of the active layer ACT connected to the third connection electrode 133 through the ninth contact hole CNT9 may be the drain of the second emission control transistor T6 and the drain of the diode initialization transistor T7.

The fourth insulating layer 104 may be disposed on the third conductive layer 130. The fourth insulating layer 104 may include an organic insulating material and/or an inorganic insulating material. The fourth insulating layer 104 may have a single-layer structure or a multilayer structure. In an embodiment, the fourth insulating layer 104 may have a single-layer structure including a polyimide (PI) layer.

The fourth conductive layer 140 may be disposed on the fourth insulating layer 104. The fourth conductive layer 140 may include a conductive material. The fourth conductive layer 140 may have a single-layer structure or a multilayer structure. In an embodiment, the fourth conductive layer 140 may have a multilayer structure including a titanium (Ti) layer, an aluminum (Al) layer, and a titanium (Ti) layer which are sequentially stacked.

The fourth conductive layer 140 may include a horizontal driving voltage line ELVDD_H, a horizontal diode initialization voltage line VAINT_H, a horizontal connection line BRS_H, a fourth connection electrode 141, and a fifth connection electrode 142. The horizontal driving voltage line ELVDD_H, the horizontal diode initialization voltage line VAINT_H, the horizontal connection line BRS_H, the fourth connection electrode 141, and the fifth connection electrode 142 may be spaced apart from each other.

The horizontal driving voltage line ELVDD_H may extend in the first direction DR1. The horizontal driving voltage line ELVDD_H may be connected to the vertical driving voltage line ELVDD_V through a tenth contact hole CNT10. The vertical driving voltage line ELVDD_V and the horizontal driving voltage line ELVDD_H may form the driving voltage line ELVDD in FIG. 6.

The horizontal driving voltage line ELVDD_H may include an extension portion EP. The extension portion EP may protrude from the horizontal driving voltage line ELVDD_H, and may extend in the second direction DR2. The extension portion EP may overlap a vertical connection line BRS_V to be described later.

The horizontal diode initialization voltage line VAINT_H may extend in the first direction DR1. The horizontal diode initialization voltage line VAINT_H may be connected to the vertical diode initialization voltage line VAINT_V through an eleventh contact hole CNT11. The vertical diode initialization voltage line VAINT_V and the horizontal diode initialization voltage line VAINT_H may form the diode initialization voltage line VAINT in FIG. 6.

The horizontal connection line BRS_H may extend in the first direction DR1. As described above, at least a portion of the horizontal initialization voltage line VINT_H may overlap the horizontal connection line BRS_H. At least a portion of the horizontal initialization voltage line VINT_H may be disposed between the horizontal connection line BRS_H and the initialization gate line GI in a plan view. For example, the horizontal initialization voltage line VINT_H may cover an edge of the horizontal connection line BRS_H which faces an edge of initialization gate line GI. The horizontal initialization voltage line VINT_H that transmits the initialization voltage, which is a constant voltage, may shield between the initialization gate line GI and the horizontal connection line BRS_H. Accordingly, coupling between the initialization gate line GI and the horizontal connection line BRS_H may decrease.

The fourth connection electrode 141 may be connected to the second connection electrode 132 through a twelfth contact hole CNT12. The fifth connection electrode 142 may be connected to the third connection electrode 133 through a thirteenth contact hole CNT13.

The fifth insulating layer 105 may be disposed on the fourth conductive layer 140. The fifth insulating layer 105 may include an organic insulating material and/or an inorganic insulating material. The fifth insulating layer 105 may have a single-layer structure or a multilayer structure. In an embodiment, the fifth insulating layer 105 may have a single-layer structure including a polyimide (PI) layer.

The fifth conductive layer 150 may be disposed on the fifth insulating layer 105. The fifth conductive layer 150 may include a conductive material. The fifth conductive layer 150 may have a single-layer structure or a multilayer structure. In an embodiment, the fifth conductive layer 150 may have a multilayer structure including a titanium (Ti) layer, an aluminum (Al) layer, and a titanium (Ti) layer which are sequentially stacked.

The fifth conductive layer 150 may include the data line DL, a vertical connection line BRS_V, and a sixth connection electrode 151. The data line DL, the vertical connection line BRS_V, and the sixth connection electrode 151 may be spaced apart from each other.

The data line DL may extend in the second direction DR2. The data line DL may be disposed in each of the first pixel PX1 and the second pixel PX2. The data line DL may be connected to the fourth connection electrode 141 through a fourteenth contact hole CNT14.

As the data line DL is included in the fifth conductive layer 150, a parasitic capacitance between the data line DL and conductive layers disposed under the data line DL may decrease. Accordingly, power consumption of the display device 1 may decrease and crosstalk of the display device 1 may decrease.

The vertical connection line BRS_V may extend in the second direction DR2. The vertical connection line BRS_V may be disposed in each of the first pixel PX1 and the second pixel PX2. The vertical connection line BRS_V may be connected to the horizontal connection line BRS_H through a fifteenth contact hole CNT15.

The vertical connection line BRS_V may overlap the vertical driving voltage line ELVDD_V. As the vertical connection line BRS_V overlaps the vertical driving voltage line ELVDD_V, aperture ratios of the pixels PX1 and PX2 may increase.

As described above, the extension portion EP of the horizontal driving voltage line ELVDD_H may overlap the vertical connection line BRS_V. For example, the extension portion EP of the horizontal driving voltage line ELVDD_H may completely cover an edge of the vertical connection line BRS_V which faces an edge of the first connection electrode 131. In other words, the extension portion EP of the horizontal driving voltage line ELVDD_H may be disposed between the vertical connection line BRS_V and the first connection electrode 131. The extension portion EP of the horizontal driving voltage line ELVDD_H that transmits the driving voltage, which is a constant voltage, may shield between the first connection electrode 131 and the vertical connection line BRS_V. Accordingly, coupling between the first connection electrode 131 and the vertical connection line BRS_V may decrease.

In an embodiment, a width of the extension portion EP of the horizontal driving voltage line ELVDD_H in the first direction DR1 may be greater than a width of the vertical connection line BRS_V in the first direction DR1. For example, the extension portion EP of the horizontal driving voltage line ELVDD_H may completely cover the vertical connection line BRS_V in the first direction DR1. In such an embodiment, the coupling between the first connection electrode 131 and the vertical connection line BRS_V may further decrease.

The sixth connection electrode 151 may be connected to the fifth connection electrode 142 through a sixteenth contact hole CNT16.

The sixth insulating layer 106 may be disposed on the fifth conductive layer 150.

The sixth insulating layer 106 may include an organic insulating material and/or an inorganic insulating material. The sixth insulating layer 106 may have a single-layer structure or a multilayer structure. In an embodiment, the sixth insulating layer 106 may have a single-layer structure including a polyimide (PI) layer.

The first electrode 160 may be disposed on the sixth insulating layer 106. The first electrode 160 may be connected to the sixth connection electrode 151 through a seventeenth contact hole CNT17. The first electrode 160 may include a transparent conductive oxide, a metal, or the like. The first electrode 160 may have a single-layer structure or a multilayer structure. In an embodiment, the first electrode 160 may have a multilayer structure including an indium tin oxide (ITO) layer, a silver (Ag) layer, and an indium tin oxide (ITO) layer which are sequentially stacked.

The pixel defining layer 107 may be disposed on the first electrode 160. The pixel defining layer 107 may define a pixel opening exposing at least a portion of the first electrode 160. The pixel defining layer 107 may include an organic insulating material and/or an inorganic insulating material. The pixel defining layer 107 may have a single-layer structure or a multilayer structure. In an embodiment, the pixel defining layer 107 may have a single-layer structure including a polyimide (PI) layer.

The intermediate layer 170 may be disposed on the first electrode 160 exposed by the pixel opening and the pixel defining layer 107. The intermediate layer 170 may include a first functional layer 171, an emission layer 172, and a second functional layer 173.

The first functional layer 171 may be disposed on the first electrode 160 exposed by the pixel opening and the pixel defining layer 107. The first functional layer 171 may include a hole injection layer (HIL) and/or a hole transport layer (HTL). Alternatively, the first functional layer 171 may be omitted.

The emission layer 172 may be disposed on the first functional layer 171. The emission layer 172 may be disposed in the pixel opening. The emission layer 172 may include an organic light emitting material, an inorganic light emitting material, a quantum dot, or the like.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxy-quinoline)aluminum, or the like, and the high molecular weight organic compound may include poly(3,4-ethylene-dioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including the core and a shell surrounding the core. The shell may serve as a protective layer for maintaining semiconductor properties by preventing chemical modification of the core and as a charging layer for imparting electrophoretic properties to the quantum dot.

The second functional layer 173 may be disposed on the first functional layer 171 with the emission layer 172 interposed between the first functional layer 171 and the second functional layer 173. The second functional layer 173 may include an electron transport layer (ETL) and/or an electron injection layer (EIL). Alternatively, the second functional layer 173 may be omitted.

The second electrode 180 may be disposed on the intermediate layer 170. The second electrode 180 may include a transparent conductive oxide, a metal, or the like. The second electrode 180 may have a single-layer structure or a multilayer structure. The first electrode 160, the intermediate layer 170, and the second electrode 180 may form the light emitting diode ED.

In the embodiments of the present disclosure, as the extension portion EP of the horizontal driving voltage line ELVDD_H shields between the first connection electrode 131 and the vertical connection line BRS_V, the coupling between the first connection electrode 131 and the vertical connection lines BRS_V may decrease. Accordingly, the scan on time SOT of the display device 1 may increase, the power consumption of the display device 1 may decrease, and the crosstalk of the display device 1 may decrease.

Figure 12:
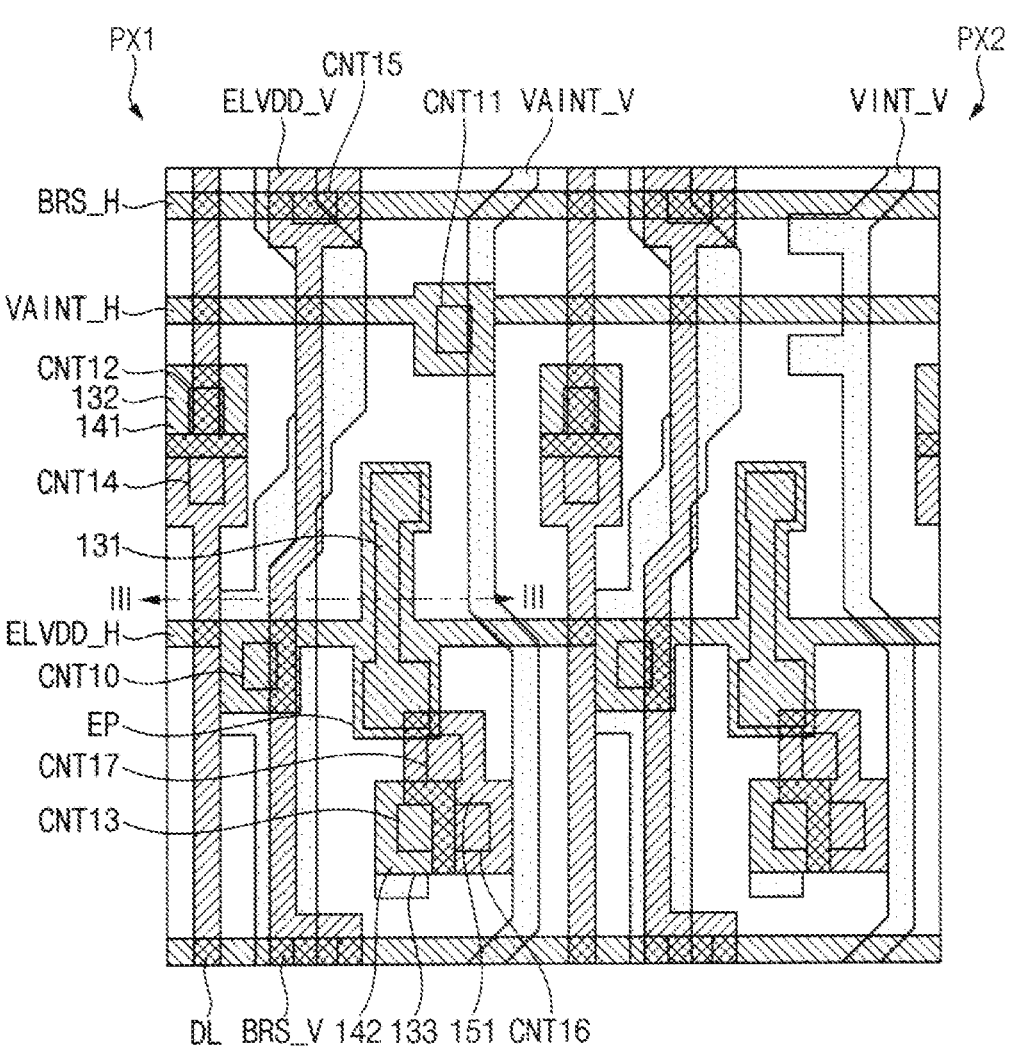
FIG. 12 is plan view illustrating a first pixel and a second pixel according to an embodiment.
Figure 12:
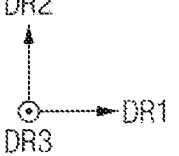
Figure 13:
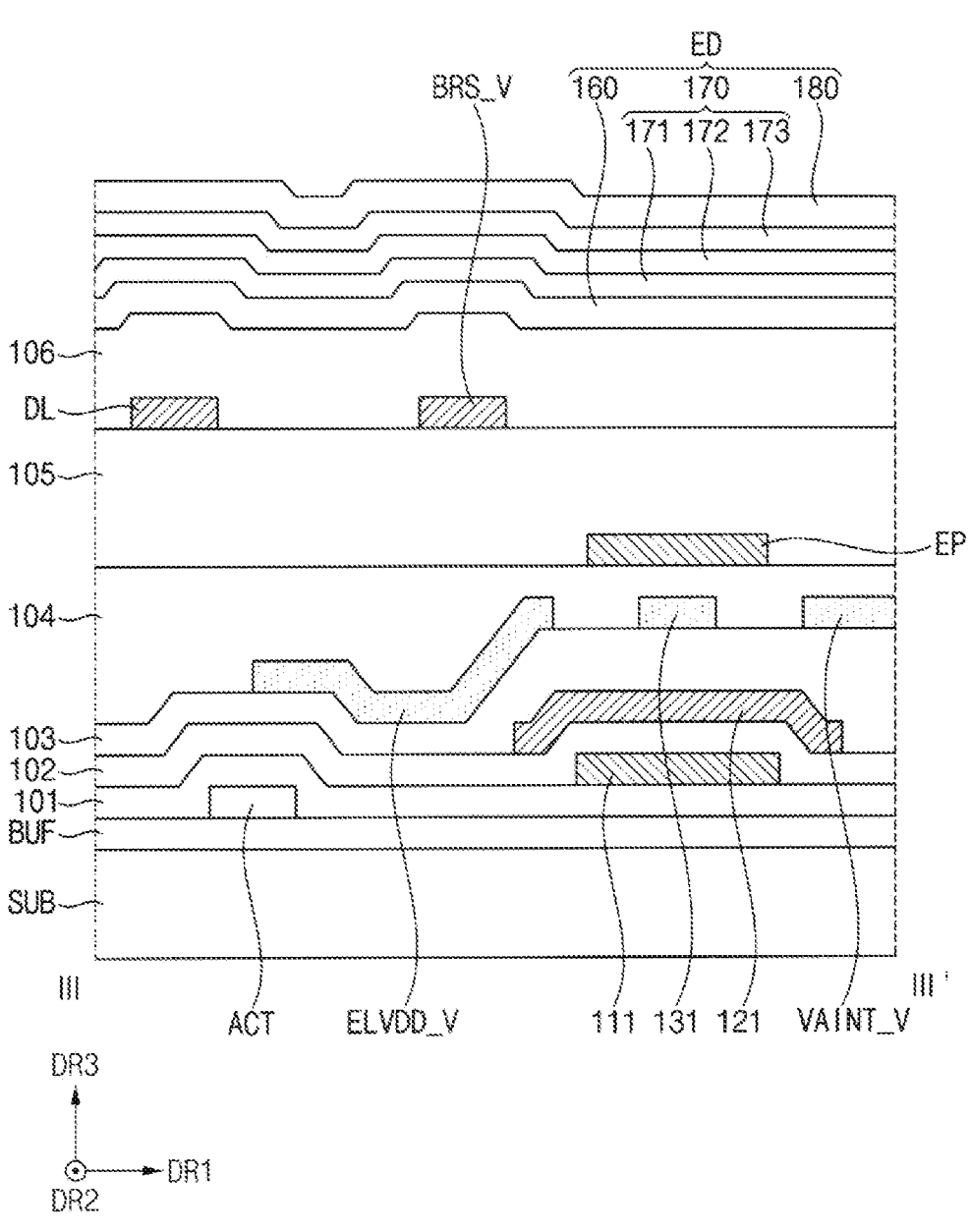
FIG. 13 is a cross-sectional view taken along a line III-III' in FIGS. 7 and 12.

FIG. 12 is plan view illustrating a first pixel PX1 and a second pixel PX2 according to an embodiment. FIG. 12 may illustrate a third conductive layer 130 (131), a fourth conductive layer 140 (EP), and a fifth conductive layer 150 (DL and BRS_V) to be described later. FIG. 13 is a cross-sectional view taken along a line III-III' in FIGS. 7 and 12.

Referring to FIGS. 7, 12, and 13, the display device 1 may include a substrate SUB, a buffer layer BUF, an active layer ACT, a first insulating layer 101, a first conductive layer 110 (111), a second insulating layer 102, a second conductive layer 120 (121), a third insulating layer 103, a third conductive layer 130 (131, ELVDD_V and VAINT_V), a fourth insulating layer 104, a fourth conductive layer 140 (EP), a fifth insulating layer 105, a fifth conductive layer 150 (DL and BRS_V), a sixth insulating layer 106, a first electrode 160, a pixel defining layer 107, an intermediate layer 170, and a second electrode 180. The display device 1 described with reference to FIGS. 7, 12, and 13 may be substantially the same as or similar to the display device 1 described with reference to FIGS. 7 to 11 except for the extension portion EP. Accordingly, descriptions of the overlapping components will be omitted.

The extension portion EP of the horizontal driving voltage line ELVDD_H may overlap the first connection electrode 131. For example, the extension portion EP of the horizontal driving voltage line ELVDD_H may completely cover the first connection electrode 131. For example, edges of the extension portion EP of the horizontal driving voltage line ELVDD_H may completely surround edges of first connection electrode 131. The extension portion EP of the horizontal driving voltage line ELVDD_H that transmits the driving voltage, which is a constant voltage, may shield between the first connection electrode 131 and the vertical connection line BRS_V. Accordingly, coupling between the first connection electrode 131 and the vertical connection line BRS_V may decrease.

In an embodiment, a width of the extension portion EP of the horizontal driving voltage line ELVDD_H in the first direction DR1 may be greater than a width of the first connection electrode 131 in the first direction DR1. In an embodiment, a length of the extension portion EP of the horizontal driving voltage line ELVDD_H in the second direction DR2 may be greater than a length of the first connection electrode 131 in the second direction DR2. In an embodiment, an area of the extension portion EP of the horizontal driving voltage line ELVDD_H may be greater than an area of the first connection electrode 131. In the above embodiments, the coupling between the first connection electrode 131 and the vertical connection line BRS_V may further decrease.

Figure 14:
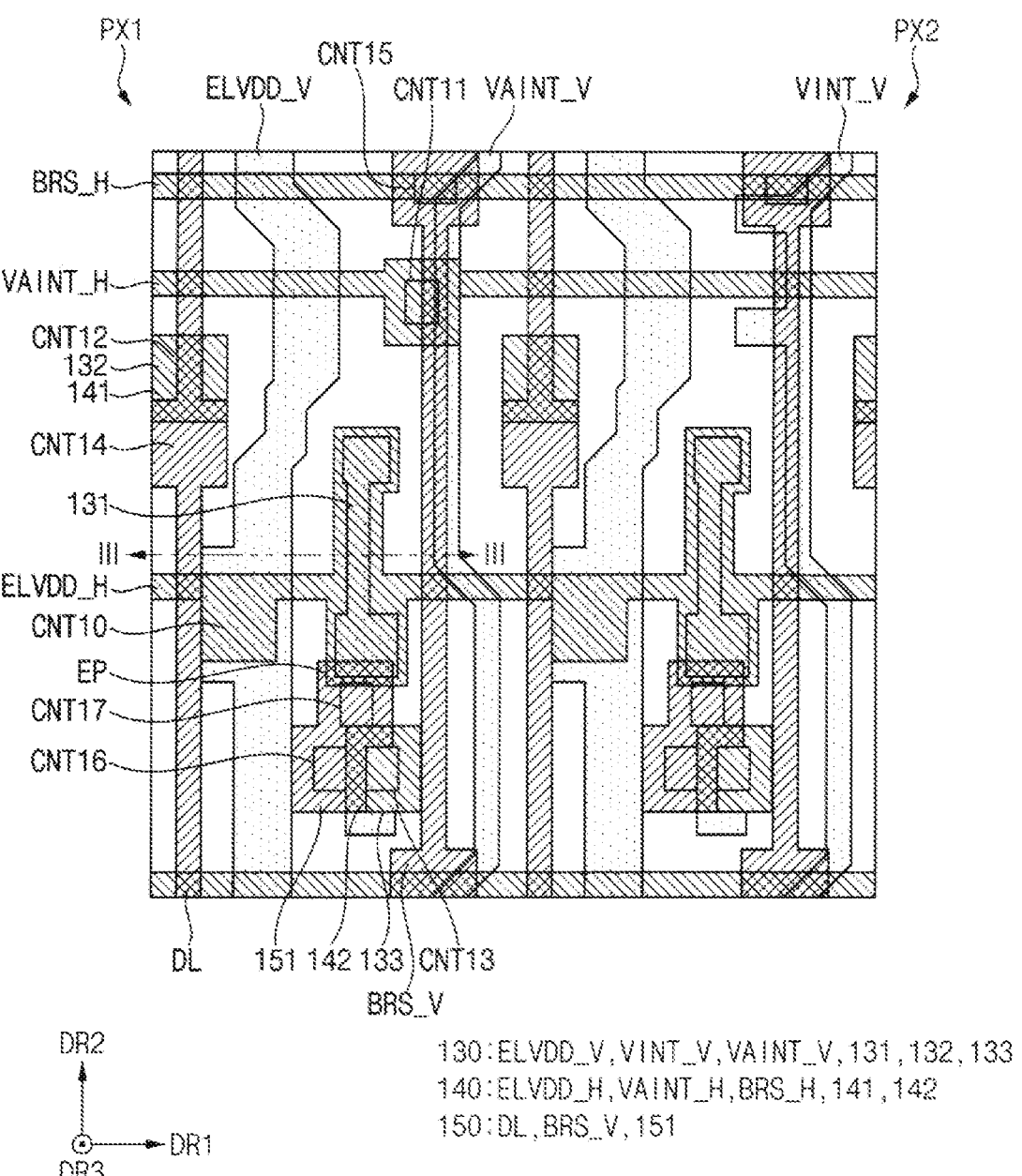
FIG. 14 is plan view illustrating a first pixel and a second pixel according to an embodiment.
Figure 15:
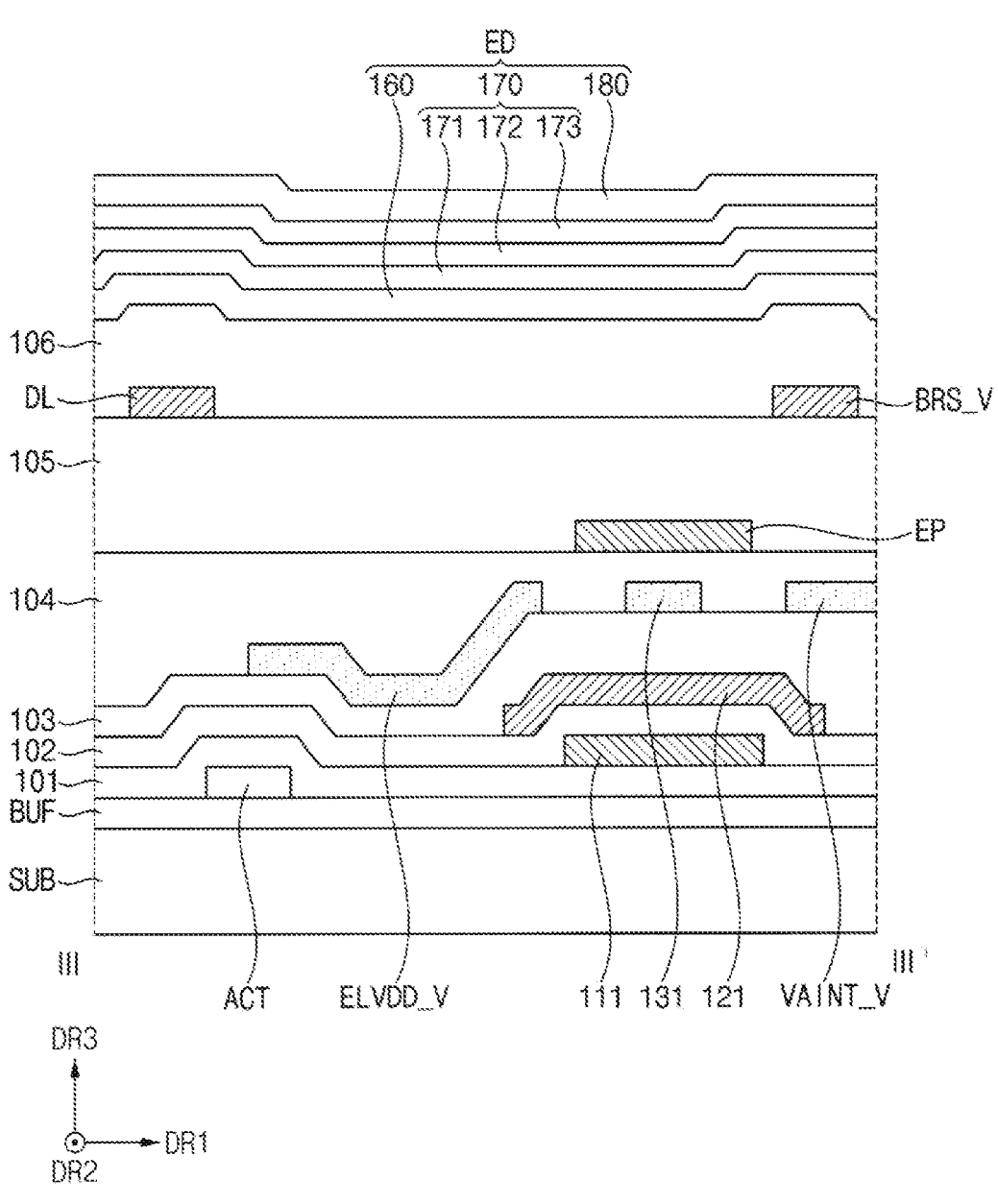
FIG. 15 is a cross-sectional view taken along a line III-III' in FIGS. 7 and 14.

FIG. 14 is plan view illustrating a first pixel PX1 and a second pixel PX2 according to an embodiment. FIG. 14 may illustrate a third conductive layer 130, a fourth conductive layer 140, and a fifth conductive layer 150 to be described later. FIG. 15 is a cross-sectional view taken along a line III-III' in FIGS. 7 and 14.

Referring to FIGS. 7, 14, and 15, the display device 1 may include a substrate SUB, a buffer layer BUF, an active layer ACT, a first insulating layer 101, a first conductive layer 110 (111), a second insulating layer 102, a second conductive layer 120 (121), a third insulating layer 103, a third conductive layer 130 (ELVDD_V, 131 and VAINT_V), a fourth insulating layer 104, a fourth conductive layer 140 (EP), a fifth insulating layer 105, a fifth conductive layer 150 (DL and BRS_V), a sixth insulating layer 106, a first electrode 160, a pixel defining layer 107 (not shown), an intermediate layer 170, and a second electrode 180. The display device 1 described with reference to FIGS. 7, 14, and 15 may be substantially the same as or similar to the display device 1 described with reference to FIGS. 7, 12, and 13 except for the fifth connection electrode 142, the vertical connection line BRS_V, and the sixth connection electrode 151. Accordingly, descriptions of the overlapping components will be omitted.

The vertical connection line BRS_V may overlap the vertical initialization voltage line VINT_V or the vertical diode initialization voltage line VAINT_V, and may not overlap the vertical driving voltage line ELVDD_V. The vertical connection line BRS_V disposed in the first pixel PX1 may overlap the vertical diode initialization voltage line VAINT_V, and the vertical connection line BRS_V disposed in the second pixel PX2 may overlap the vertical initialization voltage line VINT_V. As the vertical connection line BRS_V does not overlap the vertical driving voltage line ELVDD_V, a short circuit defect may be prevented from occurring between the vertical driving voltage line ELVDD_V and the vertical connection line BRS_V.

An upper surface of the sixth insulating layer 106 may include protrusions formed along a profile of the fifth conductive layer 150 (DL and BRS_V), and an upper surface of the first electrode 160 may include protrusions formed along the protrusions of the upper surface of the sixth insulating layer 106. As the vertical connection line BRS_V overlaps the vertical initialization voltage line VINT_V or the vertical diode initialization voltage line VAINT_V, the protrusions of the upper surface of the first electrode 160 formed along the profiles of the data line DL and the vertical connection line BRS_V may be formed in a relatively balanced manner in the first direction DR1 in each of the pixels PX1 and PX2. For example, the protrusion of the upper surface of the first electrode 160 formed along the profile of the data line DL may be formed on the left side in the first direction DR1 in each the pixels PX1 and PX2, and the protrusion of the upper surface of the first electrode 160 formed along the profile of the vertical connection line BRS_V may be formed on the right side in the first direction DR1 in each of the pixels PX1 and PX2. Accordingly, the direction of light reflected by the first electrode 160 after being generated in the emission layer 172 may be relatively uniform in the first direction DR1.

The display device according to the embodiments may be applied to a display device included in a computer, a notebook, a mobile phone, a smart phone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
an active layer disposed on a substrate;
a first conductive layer disposed on the active layer, the first conductive layer including a gate electrode;
a second conductive layer disposed on the first conductive layer;
a third conductive layer disposed on the second conductive layer, the third conductive layer including a connection electrode connecting the active layer and the gate electrode;
a fourth conductive layer disposed on the third conductive layer, the fourth conductive layer including a first driving voltage line extending in a first direction; and
a fifth conductive layer disposed on the fourth conductive layer, the fifth conductive layer including a first connection line extending in a second direction intersecting the first direction,
wherein the first driving voltage line includes an extension portion which extends in the second direction and disposed between the first connection line and the connection electrode to overlap at least one of the first connection line and the connection electrode, and
wherein the first driving voltage line is not electrically connected to the first connection line and the connection electrode.

2. The display device of claim 1, wherein the extension portion overlaps the first connection line.

3. The display device of claim 2, wherein a width of the extension portion in the first direction is greater than a width of the first connection line in the first direction.

4. The display device of claim 1, wherein the extension portion overlaps the connection electrode.

5. The display device of claim 4, wherein a width of the extension portion in the first direction is greater than a width of the connection electrode in the first direction.

6. The display device of claim 4, wherein a length of the extension portion in the second direction is greater than a length of the connection electrode in the second direction.

7. The display device of claim 4, wherein an area of the extension portion is greater than an area of the connection electrode.

8. The display device of claim 1, wherein the active layer includes a first region overlapping the gate electrode and a second region spaced apart from the first region, and
wherein the connection electrode connects the gate electrode and the second region of the active layer.

9. The display device of claim 8, wherein the first region of the active layer includes a channel of a driving transistor, and
wherein the second region of the active layer includes a drain of a compensation transistor and a drain of an initialization transistor.

10. The display device of claim 1, wherein the first conductive layer further includes a gate line extending in the first direction,
wherein the second conductive layer includes a first initialization voltage line extending in the first direction, and
wherein the fourth conductive layer further includes a second connection line extending in the first direction and connected to the first connection line.

11. The display device of claim 10, wherein at least a portion of the first initialization voltage line overlaps the second connection line.

12. The display device of claim 10, wherein the gate line includes a gate of an initialization transistor.

13. The display device of claim 10, wherein the third conductive layer further includes:
a second driving voltage line extending in the second direction and connected to the first driving voltage line; and
a second initialization voltage line extending in the second direction and connected to the first initialization voltage line.

14. The display device of claim 13, wherein the first connection line overlaps the second driving voltage line.

15. The display device of claim 13, wherein the first connection line overlaps the second initialization voltage line.

16. The display device of claim 1, wherein the fifth conductive layer further includes a data line extending in the second direction.

17. A display device comprising:
an active layer disposed on a substrate;
a first conductive layer disposed on the active layer, the first conductive layer including a gate electrode;
a second conductive layer disposed on the first conductive layer;
a third conductive layer disposed on the second conductive layer, the third conductive layer including a connection electrode connecting the active layer and the gate electrode;
a fourth conductive layer disposed on the third conductive layer, the fourth conductive layer including a first driving voltage line extending in a first direction and a first connection line extending in the first direction; and
a fifth conductive layer disposed on the fourth conductive layer, the fifth conductive layer including a data line extending in a second direction intersecting the first direction and a second connection line extending in the second direction and connected to the first connection line,
wherein the first driving voltage line includes an extension portion which extends in the second direction and disposed between the second connection line and the connection electrode to overlap at least one of the second connection line and the connection electrode, and wherein the first driving voltage line is not electrically connected to the second connection line and the connection electrode.

18. The display device of claim 17, wherein the third conductive layer further includes a second driving voltage line extending in the second direction and connected to the first driving voltage line.

19. A display device comprising:

an active layer disposed on a substrate;

a first conductive layer disposed on the active layer, the first conductive layer including a gate line extending in a first direction;

a second conductive layer disposed on the first conductive layer, the second conductive layer including a first initialization voltage line extending in the first direction;

a third conductive layer disposed on the second conductive layer;

a fourth conductive layer disposed on the third conductive layer, the fourth conductive layer including a first connection line extending in the first direction; and a fifth conductive layer disposed on the fourth conductive layer, the fifth conductive layer including a second connection line extending in a second direction intersecting the first direction and connected to the first connection line, wherein at least a portion of the first initialization voltage line overlaps the first connection line, and wherein the first initialization voltage line is not electrically connected to the first connection line.

20. The display device of claim 19, wherein the third conductive layer includes a second initialization voltage line extending in the second direction and connected to the first initialization voltage line.

21. The display device of claim 19, wherein the gate line includes a gate of an initialization transistor.

\* \* \* \* \*